(12) United States Patent
DCamp et al.

(10) Patent No.: US 7,370,530 B2
(45) Date of Patent: May 13, 2008

(54) PACKAGE FOR MEMS DEVICES

(75) Inventors: Jon B. DCamp, Savage, MN (US); Harlan L. Curtis, Champlin, MN (US)

(73) Assignee: Honeywell International Inc., Morristown, NJ (US)

( * ) Notice: Subject to any disclaimer, the term of this patent is extended or adjusted under 35 U.S.C. 154(b) by 24 days.

(21) Appl. No.: 10/931,653

(22) Filed: Sep. 1, 2004

(65) Prior Publication Data

US 2006/0042382 A1    Mar. 2, 2006

(51) Int. Cl.
*G01N 9/12* (2006.01)
*H01L 21/00* (2006.01)

(52) U.S. Cl. ............... 73/493; 438/106; 257/E25.01

(58) Field of Classification Search ............... 73/493, 73/504.12, 510; 438/15, 106, 51, 110, 121, 438/125–127; 257/E23.172, E25.01, 628, 257/730

See application file for complete search history.

(56) References Cited

U.S. PATENT DOCUMENTS

| | | | |
|---|---|---|---|
| 4,017,187 A | 4/1977 | Schwartz | 356/472 |
| 4,179,818 A * | 12/1979 | Craig | 33/321 |
| 4,212,443 A | 7/1980 | Duncan et al. | 244/177 |
| 5,490,420 A | 2/1996 | Burdess | 73/504.2 |
| 5,492,596 A | 2/1996 | Chu | 438/50 |
| 5,757,103 A | 5/1998 | Lee et al. | 310/309 |
| 5,757,490 A | 5/1998 | Martin | 356/471 |
| 5,793,116 A * | 8/1998 | Rinne et al. | 257/777 |
| 5,826,829 A | 10/1998 | Holmes | 244/165 |
| 5,869,760 A | 2/1999 | Geen | 73/504.12 |
| 5,990,472 A * | 11/1999 | Rinne | 250/214.1 |
| 5,992,233 A | 11/1999 | Clark | 73/514.35 |
| 6,067,858 A | 5/2000 | Clark et al. | 73/504.16 |

(Continued)

FOREIGN PATENT DOCUMENTS

DE    4136355 A1 *  5/1993

(Continued)

OTHER PUBLICATIONS

Chae et al., "A Monolithic Three-Axis Silicon Capacitive Accelerometer With Micro-G Resolution," Center for Wireless Integrated MicroSystems (WIMS), 4 pages, prior to filing date of present application.

(Continued)

*Primary Examiner*—Hezron Williams
*Assistant Examiner*—Tamiko Bellamy
(74) *Attorney, Agent, or Firm*—Black Lowe & Graham, PLLC

(57) ABSTRACT

A package for packaging one or more MEMS devices is disclosed. A package in accordance with an illustrative embodiment of the present invention can include a packaging structure having a base section, a top section, and an interior cavity adapted to contain a number of MEMS devices therein. In some embodiments, the packaging structure can include a first side, a second side, a third side, and a top end, which, in certain embodiments, may form a pinout plane surface that can be used to connect the packaging structure to other external components. In some embodiments, a number of MEMS-type inertial sensors contained within the interior cavity of the packaging structure can be used to detect and measure motion in multiple dimensions, if desired.

37 Claims, 4 Drawing Sheets

U.S. PATENT DOCUMENTS

| | | | |
|---|---|---|---|
| 6,089,088 A | 7/2000 | Charvet | 73/504.12 |
| 6,089,089 A | 7/2000 | Hsu | 73/504.12 |
| 6,122,961 A | 9/2000 | Geen et al. | 73/504.12 |
| 6,351,891 B1 | 3/2002 | MacGugan | 33/304 |
| 6,456,939 B1 | 9/2002 | McCall et al. | 701/220 |
| 6,522,992 B1 | 2/2003 | McCall et al. | 702/141 |
| 6,918,297 B2* | 7/2005 | MacGugan | 73/504.15 |
| 2002/0096743 A1* | 7/2002 | Spooner et al. | 257/620 |
| 2003/0209789 A1* | 11/2003 | Hanson et al. | 257/678 |
| 2003/0228025 A1* | 12/2003 | Hannah | 381/113 |
| 2004/0140475 A1* | 7/2004 | Sun et al. | 257/100 |
| 2004/0169244 A1* | 9/2004 | MacGugan | 257/416 |
| 2004/0232455 A1* | 11/2004 | DCamp et al. | 257/222 |
| 2005/0017313 A1* | 1/2005 | Wan | 257/415 |

FOREIGN PATENT DOCUMENTS

WO  WO 2004035461 A2 *  4/2004

OTHER PUBLICATIONS

Gianchandani et al., "A Bulk Dissolved Wafer Process for Microelectromechanical Devices," Jour. of Microelectromechanical Systems, vol. 1, No. 2, pp. 77-85, Jun. 1992.

Hulsing et al., "Miniature IMU Based on Micro-machined Coriolis Sensors," Institute of Navigation Proceedings of National Technical Meeting, pp. 333-360, Jan. 1993.

* cited by examiner

PACKAGE FOR MEMS DEVICES

FIELD

The present invention relates generally to the field of semiconductor manufacturing and microelectromechanical systems (MEMS). More specifically, the present invention pertains to packaging of MEMS devices.

BACKGROUND

Inertial sensors are utilized in a variety of applications for detecting and measuring inertial motion in one or more dimensions. In the design of navigational and communications systems, for example, such devices are useful in sensing slight variations in linear and rotational motion of an object traveling through space. In automotive systems, such devices can be used to sense tire rotation in antilock braking systems (ABS), and to detect the presence of a collision in airbag deployment systems. Typically, such motion is sensed by detecting and measuring displacement of a resonating structure such as a number of cantilevered beams or interdigitated comb fingers. In an inertial sensor employing a MEMS-type gyroscope and/or accelerometer, for example a number of oscillating proof masses can be used to sense displacement and/or acceleration in response to movement of the device about an input or "rate" axis. In some designs, one or more of the gyroscopes and/or accelerometers can be provided as a part of an inertial measurement unit (IMU) that can be used to measure inertial motion and acceleration in multiple dimensions about an X-axis, Y-axis, and Z-axis.

Packaging of many MEMS devices is typically accomplished using a chip carrier that mounts the MEMS device and associated electronics to an integrated circuit board or other such structure. In the fabrication of MEMS gyroscopes, for example, such chip carriers can be used to package the various drive and sense components of the gyroscope as well as any associated drive and/or sensing circuitry. The particular structure of the chip carrier may vary depending on the type of mechanical and/or electrical connection made between the chip carrier and the other components. Other factors such as heat dissipation, hermeticity, temperature, humidity, chemicals, electromagnetic fields, and/or the existence of mechanical stresses may also play an important role in the type of chip carrier utilized. Accordingly, much effort in the field has focused on providing adequate packaging safeguards to prevent corrosion and/or interference caused by such environmental conditions.

In certain applications, it may be desirable to employ multiple inertial sensors to detect and measure motion of an object in more than one dimension. To accomplish this task, many prior-art devices utilize a cluster of individual packages each containing a single inertial sensor that measures motion about a particular axis or in a particular plane. Such a grouping of inertial sensors may be called an IMU. The use of multiple packages in this manner can greatly increase the overall size of the IMU, in some cases preventing their use in those applications where space is limited. The use of multiple packages can also increase the number of interconnects and circuitry necessary in the overall structure, increasing the complexity and/or cost of the device.

SUMMARY

The present invention relates to packaging of MEMS devices. A package in accordance with an illustrative embodiment of the present invention can include a packaging structure having an interior cavity defined by two or more non-planar surfaces that are each adapted to mount one or more MEMS devices. In one illustrative embodiment, the packaging structure can include a first side, a second side, a third side, and in some cases a planar top end, which together can form a tetrahedron-shaped structure with the tip or apex portion thereof removed. Each of the sides may slope inwardly at an angle of inclination away from the base section of the packaging structure, and can in some cases include a number of bondout pads that permit the various sides and top end to be fabricated separately, diced, and then attached together during a subsequent step using an adhesive, solder, resistance welding, or other suitable attachment means. In certain embodiments, a lid can be provided at the base section of the packaging structure to hermetically seal the interior cavity, protecting the contents of the package from heat, chemicals, electrical and/or magnetic waves, or other elements within the surrounding environment. In certain embodiment, the interior cavity of the packaging structure can be vacuum-sealed. In other embodiments, the interior cavity of the packaging structure can contain an inert gas.

The various sides and/or the top end of the packaging structure may define a pinout plane surface that can be used to connect the package to other external components. If desired, a number of electronic pinouts provided through each pinout plane surface can be used to connect various electronics disposed within the interior cavity to various devices located outside of the packaging structure. In certain embodiments, the electronic pinouts may also function as bondout and/or attachment pads, allowing the package to be mounted to other external components such as a printed circuit board.

In some illustrative embodiments, a number of MEMS die may be coupled to an inner wall of the first, second, and/or third sides of the packaging structure. Each MEMS die may be configured to support an inertial sensor that detects and measures motion about a separate rate axis. In certain embodiments, for example, the package may contain a first die coupled to an inner wall of the first side and including a first inertial sensor that is adapted to detect and measure motion about an X-rate axis, a second die coupled to an inner wall of the second side and including a second inertial sensor that is adapted to detect and measure motion about a Y-rate axis, and a third die coupled to an inner wall of the third side and including a third inertial sensor that is adapted to detect and measure motion about a Z-rate axis. In use, the die and associated inertial sensors can be oriented within the interior cavity in a manner that permits inertial movement to be measured in all three dimensions.

The packaging structure can be configured to contain various electronics used in the operation of each of the inertial sensors. In certain embodiments, for example, the packaging structure may include a number of Application-Specific Integrated Circuits (ASIC's) adapted to control the drive system, sensing system, or some other desired aspect of the inertial sensors. Other electrical components (e.g. capacitors, FET's, op-amps, etc.) used in controlling the operation of the inertial sensors may also be contained within the interior cavity of the packaging structure, if desired.

DETAILED DESCRIPTION

The following description should be read with reference to the drawings, in which like elements in different drawings are numbered in like fashion. The drawings, which are not necessarily to scale, depict selected embodiments and are not intended to limit the scope of the invention. Although examples of construction, dimensions, and materials are illustrated for the various elements, those skilled in the art will recognize that many of the examples provided have suitable alternatives that may be utilized.

Figure 1:
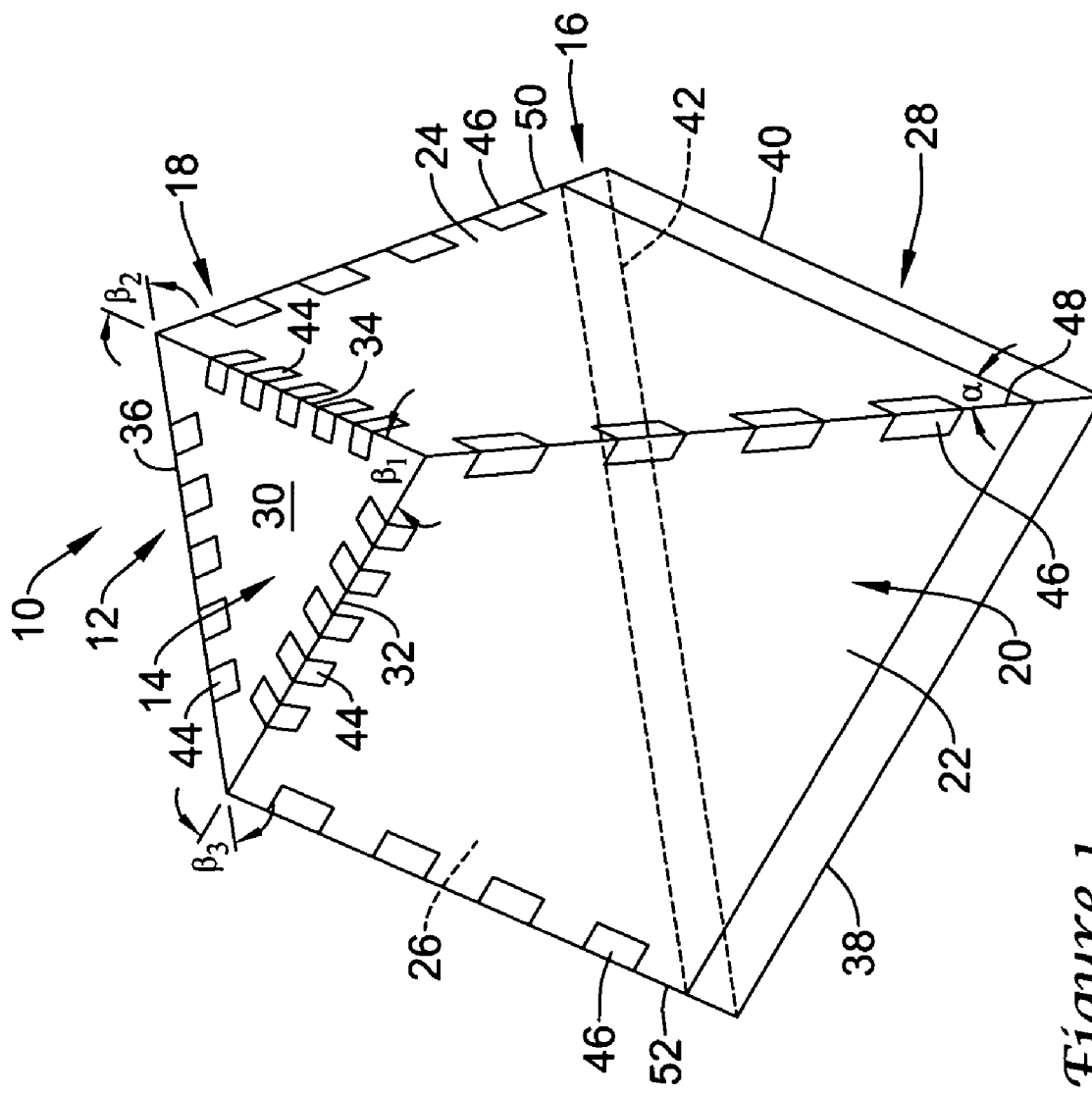
FIG. 1 is a perspective view of a three-axis package in accordance with an illustrative embodiment of the present invention.

FIG. 1 is a perspective view of a three-axis package 10 in accordance with an illustrative embodiment of the present invention. Package 10, illustratively a leadless chip carrier (LCC), can include a single packaging structure 12 having a shape similar to that of a tetrahedron with the tip or apex portion of the packaging structure 12 removed and capped to create a planar top end 14. The packaging structure 12 can include a base section 16, a top section 18, and an interior cavity 20 that can be used to package one or more MEMS devices therein. In certain embodiments, for example, such packaging structure 12 can be configured to contain a number of MEMS gyroscopes and/or accelerometers, which as is described in greater detail with respect to FIG. 2, can be used to detect and measure inertial motion in multiple dimensions. It should be understood, however, that the present invention is not limited to the packaging of inertial sensors, but instead can be used to package any number of other MEMS devices, as desired.

A first side 22 of the packaging structure 12 may slope inwardly at an angle of inclination α that extends upwardly away from the base section 14, converging towards an imaginary apex of the packing structure 12. A second and third side 24,26 of the packaging structure 12, in turn, may be similarly inclined at the same angle α such that the transverse shape of the top section 16 is similar to that of the base section 16, but scaled downwardly in size. In certain embodiments, the various sides 22,24,26 of the packaging structure 12 may slope at an angle α in the range of about 25° to 75°, and more specifically 40° to 60° from vertical, although other angles greater or lesser these ranges are possible.

While the sides 22,24,26 depicted in FIG. 1 are shown sloping inwardly away from the base section 16, it should be understood that the packaging structure 12 is not limited to such configuration. In certain alternative embodiments, for example, the sides 22,24,26 may extend outwardly from the base section 16 such that the top section 18 of the packaging structure 12 has a larger transverse shape than the base section 16 thereof. Other dimensions such as the height of the packaging structure 12 can also be altered to provide a particular shape to the packaging structure 12, as desired.

In certain embodiments, a lid 28 can be provided to hermetically seal the interior cavity 20 of the packaging structure 12, preventing elements such as chemicals, electrical and/or magnetic fields, temperature, etc. from interfering with the contents of the package 10. In one illustrative embodiment, for example, the lid 28 can be used to provide a vacuum seal within the interior cavity 20. In other embodiments, the lid 28 can be used to seal the interior cavity 20 with an inert gas such as Nitrogen or Argon. In either embodiment, the lid 28 can be coupled to the sides 22,24,26 using discrete assembly, wafer-to-wafer bonding, wafer processing techniques, and/or other suitable process.

The packaging structure 12 can be formed from a suitable material such as a ceramic (e.g. glass) or silicon that can be fabricated using bulk micromachining processes commonly used in the art. In some embodiments, other materials such as plastic and/or metals can be used in fabricating the packaging structure 12, if desired. The lid 28 can be formed from a material similar to that used in fabricating the other components of the packaging structure 12, or can have a different material composition. In the latter case, for example, the lid 28 can be formed from a metal material whereas the other components of the packaging structure 12 can be formed from a ceramic or silicon material. Typically, the lid 28 will include a material having a coefficient of thermal expansion similar to that of the material forming the remaining portion of the packaging structure 12, although other configurations are possible.

In certain embodiments, the top end 14 of the packaging structure 12 may form a pinout plane surface 30 that can be used to connect the package 10 to other components external to the packaging structure 12. The pinout plane surface 30 may be defined by a number of top edges 32,34,36, each of which may run parallel to or offset from a corresponding bottom edge 38,40,42 of the lid 28. In the illustrative embodiment of FIG. 1, for example, each top edge 32,34,36 forming the boundary of the pinout plane surface 30 runs substantially parallel to a corresponding bottom edge 38,40, 42 of the lid 28, resulting in a structure wherein the lid 28 is substantially planar with the pinout plane surface 30 of the top end 14. It should be understood, however, that the various top and bottom edges 32,34,36,38,40,42 of the packaging structure 12 can be configured such that the lid 28 is substantially non-planar to the pinout plane surface 30, if desired.

The top edges 32,34,36 of the pinout plane surface 30 may extend at angles $\beta_1$ $\beta_2$ $\beta_3$ with respect to each other, forming a triangular-shaped surface. As can be seen in the illustrative embodiment of FIG. 1, the angles $\beta_1$, $\beta_2$, $\beta_3$ may all be equal to each other (i.e. $\beta_1=\beta_2=\beta_3=60°$), forming a packaging structure 12 having a shape similar to that of a regular tetrahedron. In other embodiments, however, the angles $\beta_1$, $\beta_2$, $\beta_3$ may differ from each other, forming a packaging structure having a shape similar to that of an irregular tetrahedron with the top end 14 surface forming a scalene, isosceles, or orthogonal triangle. The angles $\beta_2$, $\beta_2$, $\beta_3$ at which each top edge 32,34,36 diverge from each other can be varied depending on the type of inertial sensor to be packaged as well as other factors.

The package 10 can include a number of electronic pinouts that can be used to connect the various electronics disposed within the interior cavity 20 to various electronics located outside of the packaging structure 12. The electronic pinouts can be placed on various portions of the packaging structure 12, including, for example, one or more of the sides 22,24,26 and/or the top end 14. In the illustrative embodiment of FIG. 1, for example, a first number of electronic pinouts 44 are shown located along top edges 32, 34, and 36 of the packaging structure 12. A second number of electronic pinouts 46, in turn, can be located along a number of side edges 48,50,52 of the packaging structure 12. In use, the electronic pinouts 44,46 provide a means to electrically connect the package 10 to other external electronics such as a printed circuit board without the need for bonding wires or the like.

In certain embodiments, the electronic pinouts 44,46 may also function as bondout pads and/or attachment pads, allowing the package 10 to be mounted directly to other external components. If, for example, the packaging structure 12 is to be surface mounted to the surface of a printed circuit board, the electronic pinouts 44,46 may further function as bonding pads to permit solder applied to the printed circuit board to bond to the packaging structure 12. In some embodiments, the electronic pinouts can also be used to secure the various sides 22,24,26 and the top end 14 together, if desired.

The packaging structure 12 can comprise a single molded piece upon which the various inertial sensors and associated electronics can be mounted, or can comprise a number of separate pieces that can be assembled together during a subsequent attachment step. In the later case, for example, the sides 22,24,26, top end 14, and lid 28 (if any) can be fabricated separately, diced, and then attached together using resistance welding, anodic bonding, adhesive, or other suitable attachment means. The MEMS devices (e.g. inertial sensors) to be packaged can be mounted prior to the attachment of the sides 22,24,26, top end 14, and lid 28, or can be mounted in a subsequent step after the sides 22,24,26, top end 14, and lid 28 have been attached together.

While the illustrative package 10 depicted in FIG. 1 has the general shape of a tetrahedron, it should be understood that the package 10 could assume other shapes, if desired. In certain alternative embodiments, for example, the package 10 can include a packaging structure having a generally polyhedron-shaped configuration such as a pyramid, pentahedron, hexahedron, or heptahedron. The number and/or configuration of the sides may vary depending on the number of MEMS devices to be packaged as well as other design considerations. As with the illustrative embodiment of FIG. 1, the apex and/or other portions of the packaging structure can be removed to form one or more pinout plane surfaces of the package, if desired.

Figure 2:
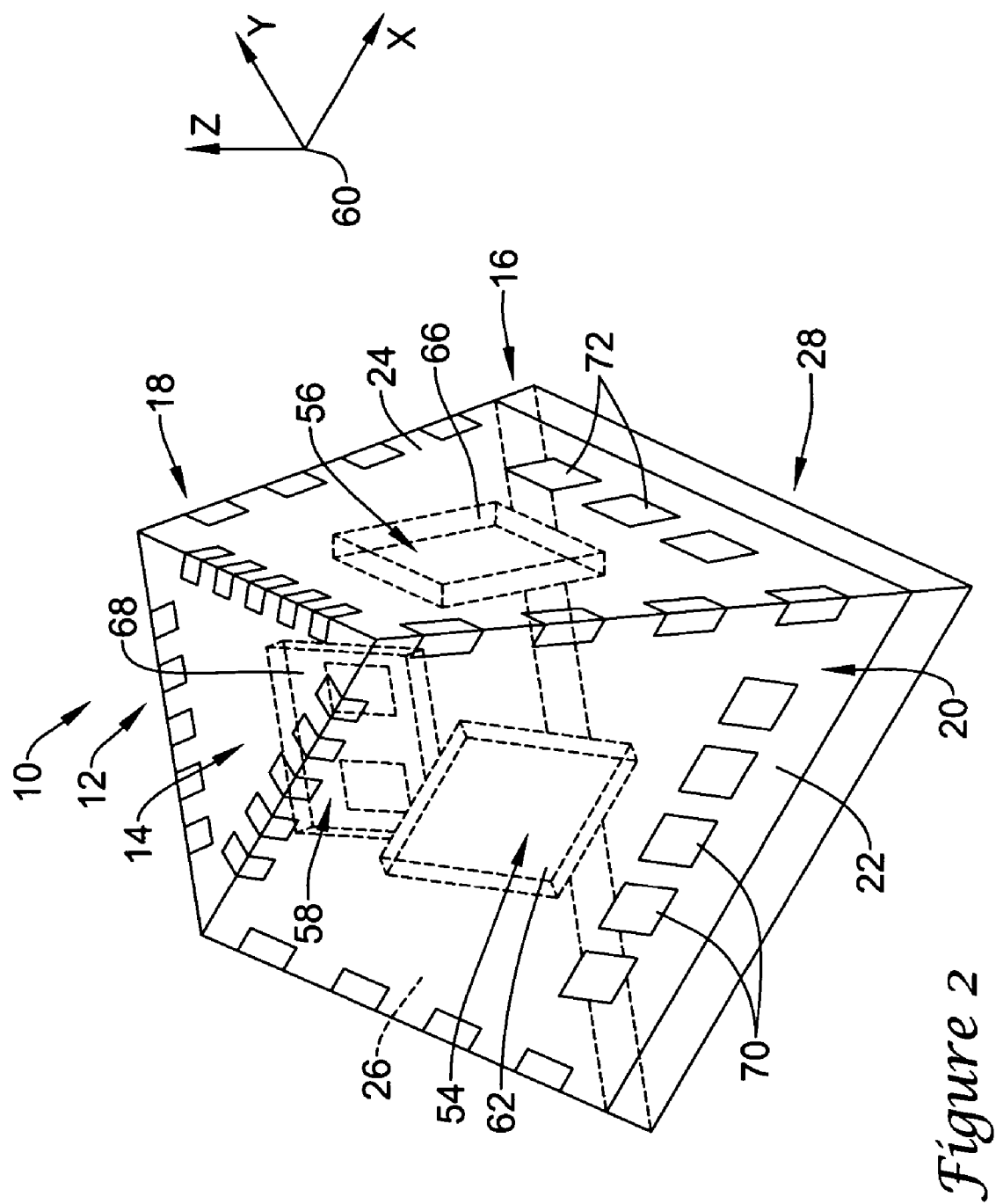
FIG. 2 is a perspective view showing the illustrative package of FIG. 1 packaging a three-axis MEMS-type inertial sensor cluster in accordance with an illustrative embodiment of the present invention.

FIG. 2 is a perspective view showing the illustrative package 10 of FIG. 1 packaging a three-axis MEMS-type inertial sensor cluster in accordance with an illustrative embodiment of the present invention. As can be seen by dashed lines in FIG. 2, the interior cavity 20 of the package 10 may contain a number of MEMS-type inertial sensors 54,56,58 that together can be can be used to detect and measure inertial motion about a three-dimensional rate axis 60 having an X-axis rate component, a Y-axis rate component, and a Z-axis rate component. In certain embodiments, for example, the inertial sensors 54,56,58 may include a number of MEMS-type gyroscopes and/or accelerometers that can be configured to detect and measure angular velocity and/or acceleration of the package 10 about each of the X, Y, and Z-rate axes. Such devices, which are described, for example, in co-pending U.S. patent application Ser. No. 10/746,219, entitled "Method for Reducing Harmonic Distortion in Comb Drive Devices" (incorporated herein by reference in its entirety), typically rely on the use of an oscillating proof mass or other resonating structure that can be used to sense motion induced by the Coriolis effect as the device rotates about a rate axis.

A first die 62 disposed within the interior cavity 20 of the packaging structure 12 can be used to support and mount the first inertial sensor 54 to an inner wall surface 64 (see FIG. 3) of the first side 22. In similar fashion, a second and third die 66,68 disposed within the interior cavity 20 of the packaging structure 12 can be used to support and mount the second and third inertial sensors 56,58, respectively, to inner wall surfaces of the second and third sides 24,26. In the illustrative embodiment of FIG. 2, each of the dies 62,66,68 may be oriented lengthwise along the inner wall surface of the sides 22,24,26 in a direction substantially parallel, respectively, to the X, Y, and Z-rate axes. The die 62,66,68 can be oriented within the interior cavity 20 in a manner that permits inertial movement of the package 10 to be measured in all three dimensions. In certain embodiments, for example, the inner wall surfaces of each side 22,24,26 can be configured to orient the die 62,66,68 orthogonally with respect to each other.

The packaging structure 12 can further include other electrical components used in the operation of each of the inertial sensors 54,56,58. In certain embodiments, for example, the packaging structure 12 may include a number of Application-Specific Integrated Circuits (ASIC's) adapted to control the drive system, sensing system, or some other desired aspect of the inertial sensors 54,56,58. Other electrical components such as capacitors, FET's, op-amps, etc. that are typically used in controlling the operation of the inertial sensors 54,56,58 may also be contained within the interior cavity 20 of the packaging structure 12, if desired.

When placed within the interior cavity 20, the overall size of the package 10 can be reduced significantly, in some cases by 30% or more over prior art designs. The ability to package multiple inertial sensors within a small space may permit the package 10 to fit within a relatively tight space while reducing the overall weight of the structure. While all or a portion of the electronics can be located within the interior cavity 20 of the packaging structure 12, it should be understood that such electronics can be positioned outside of the packaging structure 12, if desired.

As can be further seen in FIG. 2, a number of electronic pinouts can be provided on one or more of the sides 22,24,26 and/or the top end 14 to connect each of the inertial sensors 54,56,58 and/or other internal electronics to one or more external devices. As shown in FIG. 2, for example, a first set of electronic pinouts 70 disposed on the first side 22 of the packaging structure 12 can be provided to connect the package 10 to one or more external components (e.g. wire leads coupled to a printed circuit board). In similar fashion, a second set of electronic pinouts 72 disposed on the second side 24 of the packaging structure 12 can be provided, if desired. A number of interconnect wires may be provided within the interior cavity 20 of the packaging structure 12 to connect the various inertial sensors 54,56,58 and/or associated electronics together. As with the electronic pinouts 44,46 coupled to the top and side edges 32,34,36,48,50,52 of the packaging structure 12, the first and second set of electronic pinouts 70,72 can also serve as bondout and/or attachment pads, if desired.

Figure 3:
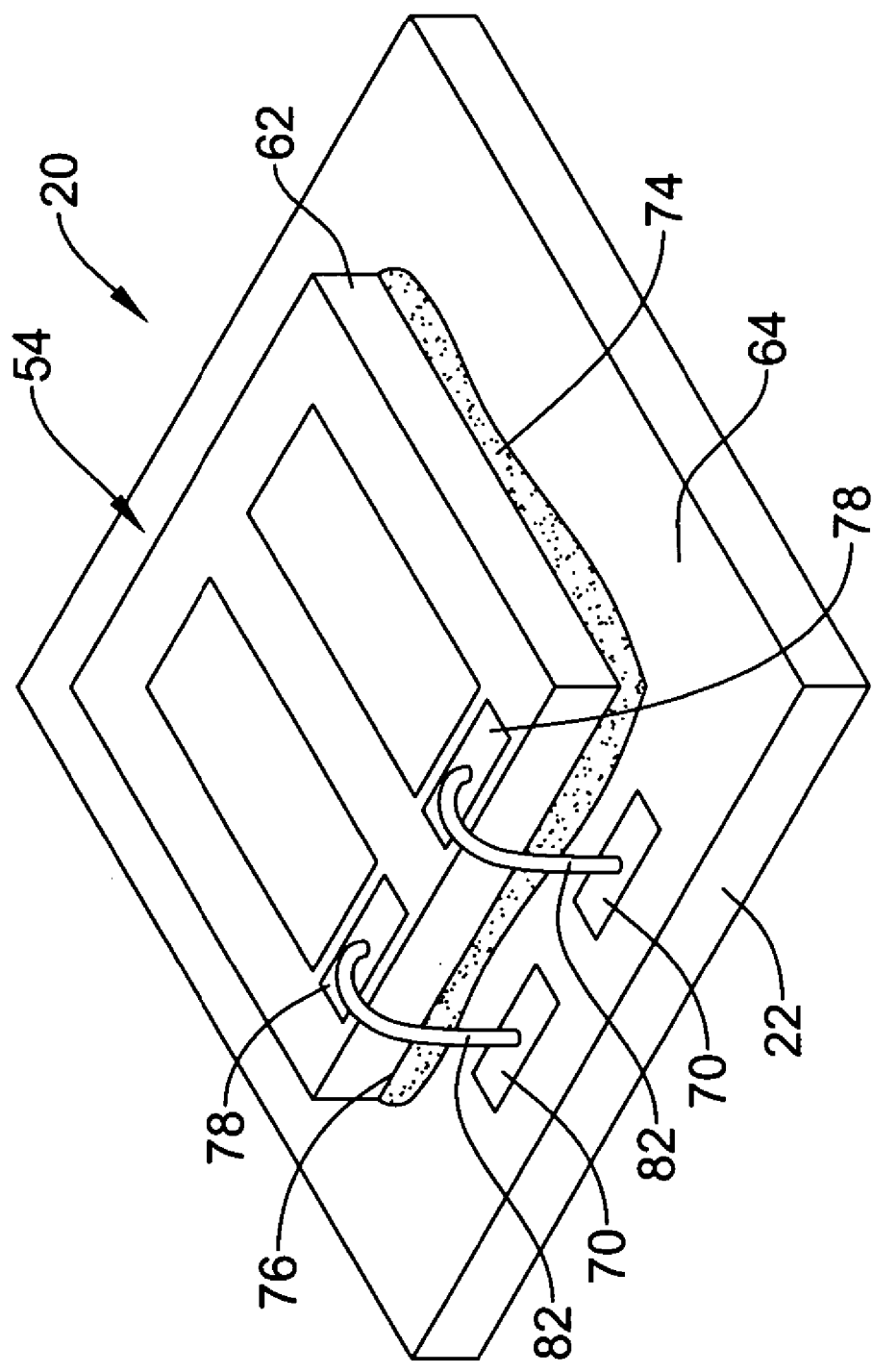
FIG. 3 is a perspective view showing the connection of one inertial sensor die to the illustrative package of FIG. 2 using a layer of adhesive or epoxy.

FIG. 3 is a perspective view showing the connection of one of the inertial sensors 54 to the illustrative package 10 of FIG. 2 using a layer of adhesive or epoxy. As can be seen in FIG. 3, the die 62 can be connected to the inner wall 64 of side 22 such that the moving components of the inertial sensor 54 face inwardly within the interior cavity 20. A similar configuration can be provided for the second and third dies 66,68, if desired, connecting the second and third inertial sensors 56,58 to the inner wall of sides 24 and 26 in like fashion.

In the illustrative embodiment of FIG. 3, a layer adhesive or epoxy 74 is shown disposed between the backside 76 of the die 62 and the inner wall 64 of side 22. In certain embodiments, the layer of adhesive or epoxy 74 can include metal filler (e.g. metal flakes), which can be used to bond the die 62 to the inner wall 64 of side 22 at temperatures in the range of about 100 to 200° C., although other methods are possible. In an alternative approach, the backside 76 of the die 62 may include a layer of metal such as gold, allowing the die 62 to be soldered to a corresponding metal layer formed on the inner wall 64 of the side 22.

The inertial sensor 54 may further include a number of bonding pads 78 that can be used to connect the inertial sensor 54 to the corresponding electronic pinouts 70 formed through the side 22 of the packaging structure 12. In some embodiments, a wire lead 82 coupled at one end to the bonding pad 78 and at the opposite end to a corresponding electronic pinout 70 can be used to electrically connect the inertial sensor 54 to other external components, if desired. While wire leads 82 are specifically depicted in the illustrative embodiment of FIG. 3, it should be understood that other attachment means can be used to electrically connect the inertial sensor 54 to the packaging structure 12, if desired.

Figure 4:
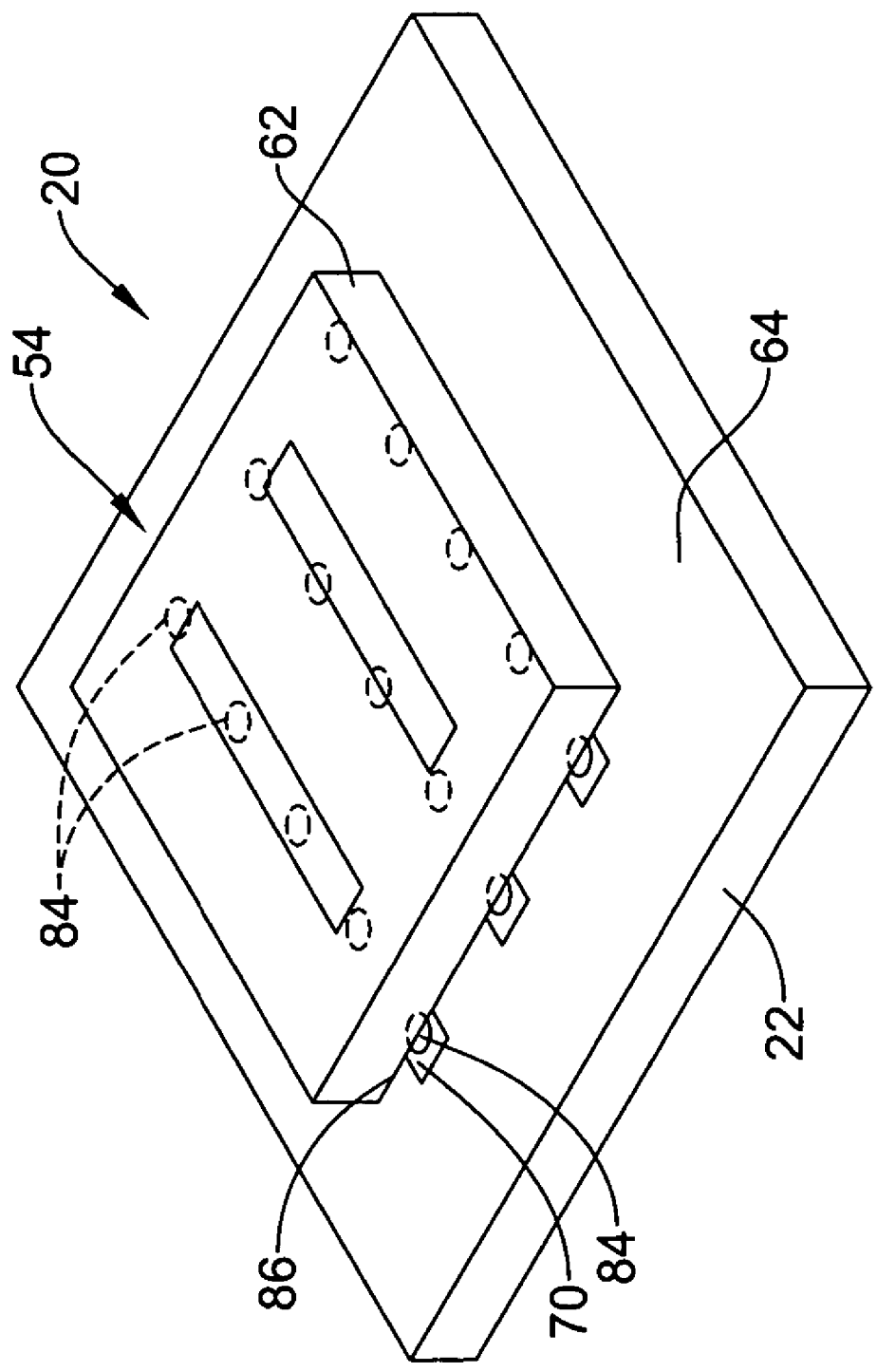
FIG. 4 is a perspective view showing the connection of one inertial sensor die to the illustrative package of FIG. 2 using a thermocompression bonding technique.

FIG. 4 is a perspective view showing the connection of one of the illustrative inertial sensors 54 to the illustrative package 10 of FIG. 2 using a thermocompression bonding technique. As can be seen in FIG. 4, a number of contacts 84 extending upwardly from the inner wall 64 of side 22 can be configured to bond to the backside surface 86 of the die 62, allowing the die 62 to be directly mounted to the inner wall 64. In certain embodiments, the contacts 84 can be formed by depositing gold or other suitable metal in a pattern onto the inner wall 64 prior to the attachment of the die 62. The backside 86 of the die 62 may similarly include a layer of metal (e.g. gold) that, when subjected to high temperatures and pressures during bonding, causes the die and side 22 to fuse together. In some embodiments, electronic pinouts 70 can be provided adjacent one or more of the contacts 86 to electrically connect the inertial sensor 54 to other external components, if desired.

While several bonding techniques are specifically described herein, it should understood that other alternative techniques can be utilized to attach the die 62,66,68 to the sides 22,24,26. Examples of other suitable techniques may include, but are not limited to, flip-chip thermocompression bonding, eutectic bonding, sintering, cluster bump bonding, ultrasonic bonding, thermosonic bonding, soldering, or combinations thereof.

Having thus described the several embodiments of the present invention, those of skill in the art will readily appreciate that other embodiments may be made and used which fall within the scope of the claims attached hereto. Numerous advantages of the invention covered by this document have been set forth in the foregoing description. It will be understood that this disclosure is, in many respects, only illustrative. Changes may be made in details, particularly in matters of shape, size and arrangement of parts without exceeding the scope of the invention.

What is claimed is:

1. A package, comprising:
a packaging structure having a first sidewall, a second sidewall, and a third sidewall, joined to define an interior cavity, the packaging structure further having a planar top member coupled to a first end portion of the respective sidewalls and a bottom lid coupled to an opposite end portion of the respective sidewalls, the planar top member distally located from the bottom lid, the respective sidewalls, top member, and bottom lid cooperating to enclose the interior cavity;
a first MEMs device mounted within the interior cavity and on an inner wall surface on the first sidewall;
a second MEMs device mounted within the interior cavity and on an inner wall surface of the second sidewall; and
a thirds MEMs device mounted within the interior cavity and on an inner wall surface of the third sidewall.

2. The package of claim 1, wherein each of the first, second, and third sidewalls slope inwardly at an angle of inclination away from a base section of the packaging structure.

3. The package of claim 2, wherein the angle of inclination for each of the first, second, and third sidewalls is substantially equal.

4. The package of claim 1, wherein the lid comprises a material different than the remaining portion of the packaging structure.

5. The package of claim 1, wherein the interior cavity is a hermetically sealed cavity.

6. The package of claim 1 wherein the interior cavity is vacuum sealed.

7. The package of claim 1 wherein the interior cavity contains an inert gas.

8. The package of claim 1, wherein the packaging structure has the general shape of a regular tetrahedron with an apex portion thereof removed.

9. The package of claim 1, wherein the packaging structure has the general shape of a irregular tetrahedron with an apex portion thereof removed.

10. The package of claim 1, wherein the planar top member includes a pinout plane surface.

11. The package of claim 1, wherein the packaging structure further includes a number of electronic pinouts.

12. The package of claim 1, wherein the packaging structure further includes one or more bondout pads adapted to connect the package to one or more external components.

13. The package of claim 1, wherein each of the first, second, and third MEMS devices is coupled to or part of a corresponding die.

14. The package of claim 13, wherein each die is bonded to the corresponding inner wall surface using an adhesive.

15. The package of claim 13, wherein each die is bonded to the corresponding inner wall surface using a thermocompression bonding technique.

16. The package of claim 15, wherein said thermocompression bonding technique is a flip-chip thermocompression bonding technique.

17. The package of claim 13, wherein each die is bonded to the corresponding inner wall surface using a solder.

18. The package of claim 1, wherein each MEMS device is a gyroscope.

19. The package of claim 1, wherein each MEMS device is a accelerometer.

20. The package of claim 1, wherein said package is a three-axis LCC package.

21. The package of claim 1, wherein the packaging structure comprises a single molded piece.

22. The package of claim 1, wherein the packaging structure comprises a number of separate pieces assembled together.

23. A three-axis package, comprising:
a first sidewall, a second sidewall, and a third sidewall coupled together to define an interior cavity;
a planar top member coupled to a first end portion of the respective sidewalls;
a bottom lid coupled to an opposite end portion of the respective sidewalls, the planar top member distally located from the bottom lid, the respective sidewalls, top member, and bottom lid cooperating to enclose the interior cavity; and
a MEMs device mounted on at least one of the respective sidewalls.

24. The three-axis package of claim 23, wherein each of the first, second and third sidewalls slope inwardly at an angle of inclination that is less than 90 degrees relative to the base section of the packaging structure.

25. The three-axis package of claim 24, wherein the angle of inclination for each of the first, second, and third sidewalls is substantially equal.

26. The three-axis package of claim 23, wherein the top end of the packaging structure defines a pinout plane surface.

27. The three-axis package of claim 23, wherein the packaging structure further includes a number of electronic pinouts.

28. The three-axis package of claim 23, wherein the packaging structure further includes one or more bondout pads adapted to connect the package to one or more external components.

29. The three-axis package of claim 23, further comprising a plurality of die, each provided in the interior cavity and each coupled to a corresponding one of the first, second, and third sidewalls of the packaging, each die coupled to a sensor adapted to detect and measure motion of the package about a separate rate axis.

30. The three-axis package of claim 29, wherein each die is oriented substantially parallel with an inner wall surface of each the corresponding sidewall of the packaging.

31. The three-axis package of claim 30, wherein each die is bonded to the corresponding inner wall surface using an adhesive.

32. The three-axis package of claim 30, wherein each die is bonded to the corresponding inner wall using a thermocompression bonding technique.

33. The three-axis package of claim 32, wherein said thermocompression bonding technique is a flip-chip thermocompression bonding technique.

34. The three-axis package of claim 30, wherein each is bonded to the corresponding inner wall surface using a solder.

35. The three-axis package of claim 29, wherein said plurality of die includes:
a first die coupled to the first side of the packaging structure, said first die including a first sensor adapted to detect and measure motion about an X-rate axis;
a second die coupled to the second side of the packaging structure, said second die including a second sensor adapted to detect and measure motion about a Y-rate axis; and
a third die coupled to the third side of the packaging structure, said third die including a third sensor adapted to detect and measure motion about a Z-rate axis.

36. The three-axis package of claim 23, wherein said plurality of MEMS devices are gyroscopes.

37. The three-axis package of claim 23, wherein said plurality of MEMS devices are accelerometers.

* * * * *